(12) United States Patent
Stockinger et al.

(10) Patent No.: US 11,862,625 B2
(45) Date of Patent: Jan. 2, 2024

(54) AREA-EFFICIENT ESD PROTECTION INSIDE STANDARD CELLS

(71) Applicant: NXP USA, Inc., Austin, TX (US)

(72) Inventors: Michael A. Stockinger, Austin, TX (US); Mohamed Suleman Moosa, Austin, TX (US); Vasily Vladimirovich Korolev, Moscow (RU); Irina Yuryevna Bashkirova, Moscow (RU); Olga Olegovna Sibagatullina, Moscow (RU)

(73) Assignee: NXP USA, Inc., Austin, TX (US)

( * ) Notice: Subject to any disclaimer, the term of this patent is extended or adjusted under 35 U.S.C. 154(b) by 108 days.

(21) Appl. No.: 17/647,531

(22) Filed: Jan. 10, 2022

(65) Prior Publication Data

US 2023/0223394 A1    Jul. 13, 2023

(30) Foreign Application Priority Data

Jul. 1, 2021   (RU) .............................. RU202119348

(51) Int. Cl.
*H01L 27/02*       (2006.01)
*H02H 9/04*        (2006.01)

(52) U.S. Cl.
CPC ...... *H01L 27/0255* (2013.01); *H01L 27/0266* (2013.01); *H02H 9/046* (2013.01)

(58) Field of Classification Search
CPC .. H01L 27/0255; H01L 27/0266; H02H 9/046
(Continued)

(56) References Cited

U.S. PATENT DOCUMENTS 5,159,518 A * 10/1992 Roy .................... H01L 27/0255
257/357
8,872,269 B2    10/2014 Yang et al.
(Continued)

FOREIGN PATENT DOCUMENTS

CN       114783994 A  *  7/2022  ......... H01L 27/0262
CN       217641333 U  *  10/2022  ........... H02H 1/0007
(Continued)

OTHER PUBLICATIONS

Alvin L.S. Loke, FinFET Technology Considerations for Circuit Design, Short Course, BCICTS, Monterey, CA Nov. 16, 2020, pp. 1-39.

(Continued)

*Primary Examiner* — Dharti H Patel

(57) ABSTRACT

An integrated circuit is provided with a protected circuit wherein a first FinFET operably coupled to a signal node is protected against electrostatic discharge voltage damage by a standard cell electrostatic discharge protection circuit which is connected between first and second voltage supplies and which includes a first FinFET diode connected between the signal node and the first voltage supply, and a second FinFET diode connected between the signal node and the second voltage supply, where the first and second FinFET diodes are each formed with a FinFET device comprising (1) a body well region forming a first diode terminal connected to one of the first or second voltage supplies, and (2) a shorted gate, source, and drain regions forming a second diode terminal connected to the signal node.

20 Claims, 5 Drawing Sheets

(58) Field of Classification Search
USPC .......................................................... 361/56
See application file for complete search history.

(56) References Cited

U.S. PATENT DOCUMENTS

| | | | | |
|---|---|---|---|---|
| 9,478,533 | B2 | 10/2016 | Ma et al. | |
| 9,929,139 | B2* | 3/2018 | Fan | H01L 27/0255 |
| 10,312,230 | B2* | 6/2019 | Torres | H01L 27/0285 |
| 10,944,258 | B2* | 3/2021 | Lai | H01L 27/0924 |
| 11,444,445 | B2* | 9/2022 | Dua | H02H 3/08 |
| 11,626,719 | B2* | 4/2023 | Yeh | H01L 27/0292 |
| | | | | 361/100 |
| 2010/0296213 | A1* | 11/2010 | Lee | H01L 27/0251 |
| | | | | 361/111 |
| 2017/0221879 | A1* | 8/2017 | Wang | H01L 27/0288 |
| 2021/0296889 | A1* | 9/2021 | Walker | H01L 27/0292 |
| 2021/0391703 | A1* | 12/2021 | Dua | H02H 3/08 |
| 2021/0408786 | A1* | 12/2021 | Dundigal | H03K 17/0822 |
| 2023/0139245 | A1* | 5/2023 | Grad | H02H 9/046 |
| | | | | 361/56 |

FOREIGN PATENT DOCUMENTS

| | | | | |
|---|---|---|---|---|
| CN | 115810583 A | * | 3/2023 | ........... H01L 25/065 |
| EP | 3200228 A1 | * | 8/2017 | ......... H01L 27/0285 |
| WO | WO-2015122974 A1 | | 8/2015 | |
| WO | WO-2016204866 A1 | | 12/2016 | |

OTHER PUBLICATIONS

Jagar Singh et al., Analog, RF, and ESD Device Challenges and Solutions for 14nm FinFET Technology and Beyond, IEEE 2014 Symposium on VLSI Technology, Digest of Technical Papers, Jun. 9-12, 2014, pp. 1-2.

Pedro Fiejoo et al., Time Dependent Dielectric Breakdown on Subnanometer EOT nMOS FinFETs, IEEE Transactions on Device and Materials Reliability, vol. 12, No. 1, Mar. 2012, pp. 166-170.

Xuejue Huang et al., Sub 50-nm FinFET: PMOS, IEEE International Electron Devices Meeting 1999, Technical Digest (Cat. No. 99CH36318), Dec. 5-8, 1999, Washington, DC, USA, pp. 67-70.

You Li et al., Design and Optimization of ESD P-Direction Diode in Bulk FinFET Technology, IEEE 2018 40th Electrical Overstress/ Electrostatic Discharge Symposium (EOS/ESD), Sep. 23-28, 2018, Reno, NV, USA, pp. 1-7.

* cited by examiner

AREA-EFFICIENT ESD PROTECTION INSIDE STANDARD CELLS

BACKGROUND

Field

The present disclosure is directed in general to integrated circuits (ICs). In one aspect, the present disclosure relates generally to protection from transient electrical stress (TES) events for integrated circuits.

Description of the Related Art

Integrated circuits are designed to operate over limited voltage ranges, and the standard device models that circuit designers typically find in a process design kit (PDK) cover the normal operating voltage and current ranges. However, exposure to sudden and extremely high voltages, such as electrostatic discharge (ESD) events, can damage or destroy an integrated circuit (IC) which often has many external terminals or pads connected to internal circuitry fabricated on a very small scale. To protect against such ESD events, IC designers use ESD event models, such as Human Body Model (HBM), Machine Model, or Charged Device Model (CDM), to design transient voltage suppression circuits, thereby providing a high level of predictive capability to ensure first-pass ESD success of a new product and to avoid costly design re-spins. However, there are numerous design challenges and constraints with designing transient voltage suppression circuits, especially with newer integrated circuit designs which include multiple supply domains where ESD stresses can cause internal circuit damage. In addition, there are significant layout design constraints with including transient voltage suppression circuits in integrated circuits since the use of standard cell design layouts can be disrupted by inserting an ESD protection circuit which requires a large circuit area.

As can be seen from the foregoing, the existing solutions for protecting against transient or ESD voltage events are extremely difficult at a practical level by virtue of the difficulty in balancing the cost, complexity, and circuit area requirements with the ESD protection performance of transient voltage suppression circuits.

BRIEF DESCRIPTION OF THE DRAWINGS

The present invention may be understood, and its numerous objects, features and advantages obtained, when the following detailed description of a preferred embodiment is considered in conjunction with the following drawings.

Figure 1:
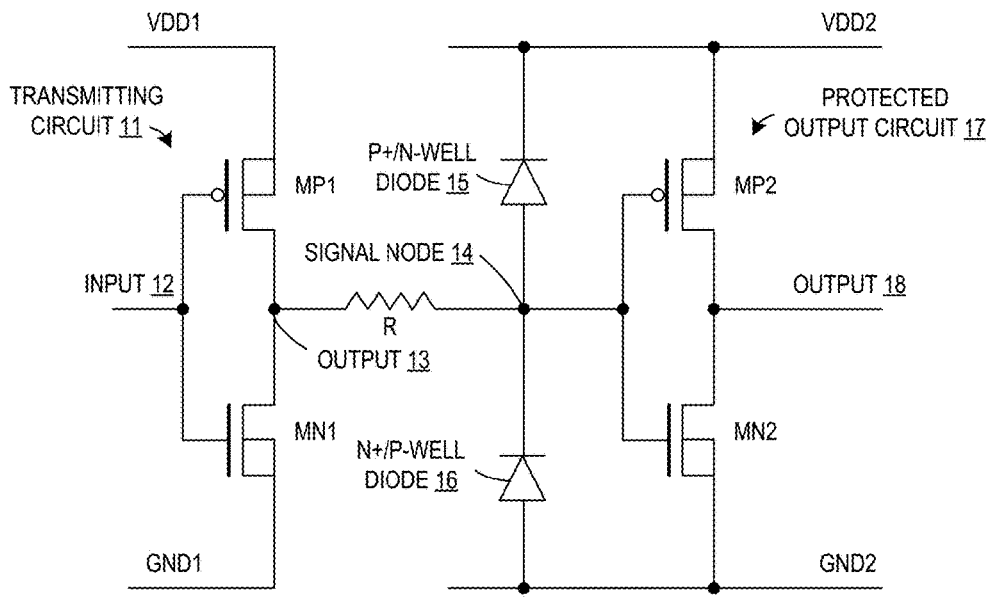
FIG. 1 is a simplified circuit diagram of an ESD protection device implemented with conventional diodes connected in series between supply lines to protect an output circuit against voltage transients.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A compact standard cell electrostatic discharge (ESD) protection device and associated methods of operation and fabrication are described for protecting an integrated circuit signal node against transient voltage events using a dual-diode protection scheme implemented with "dummy" n-FinFET and p-FinFET devices formed with centered well taps to integrate seamlessly within the standard cell integrated circuit. In selected embodiments, the ESD protection device is implemented as a standard cell-based charged device model (CDM) protection cell having centrally located n-well and p-well taps positioned internally within a pair of CDM diodes formed with "dummy" FinFET devices (e.g., a p-FinFET and n-FinFET), each having a supply-connected first diode terminal formed with the body well, and a signal node-connected second diode terminal formed with the shorted gate, source and drain regions. In particular, a first "dummy" n-FinFET may be connected as a FinFET/CDM diode between the signal node and a ground supply, and a second "dummy" p-FinFET may be connected as a FinFET/CDM diode between the signal node and a power supply. In embodiments where the signal node is coupled to a FinFET gate of a receiving circuit, the CDM protection cell provides CDM protection to prevent this gate from failing. As disclosed herein, the receiving FinFET may be located in another cell. Alternatively, the receiving FinFET may be located in a functional block of the CDM protection cell, such as a buffer, inverter, level-shifter, or the like. In such embodiments, the FinFET/CDM diode devices and the functional block may be partitioned and distributed in two portions placed on either sides of the CDM protection cell so that the n-well and p-well taps may be centrally placed in close proximity to both portions to make good well connections. Instead of using dedicated junction diodes which require substantial circuit area, the disclosed compact standard cell ESD protection device uses "dummy" FinFETs which can be readily integrated with the existing standard cell framework to achieve the same CDM protection performance with significant area savings compared to CDM protection designs using conventional diodes. While compatible with advanced 5 nm FinFET "continuous active" technologies, the floorplan of the standard cell-based CDM protection cell is universal and may be applied to CDM protection for cross-domain interfaces in any suitable technology.

To provide additional details for a contextual understanding of the present disclosure, reference is now made to FIG. 1 which shows a simplified circuit diagram 10 of a ESD protection device implemented with complementary diodes 15, 16 implemented with conventional P+/n-well and N+/p-well junctions. Connected in series between supply lines VDD2, GND2, the complementary diode pair 15, 16 protects the FET gates MP2, NP2 of the output circuit 17 against damage from voltage transient events generated at the output of the transmitting circuit 11. In particular, the transmitting circuit 11 may be any input signal pad, pin or functional circuit connected between supply lines in a first domain (e.g., VDD1, GND1). For example, the transmitting circuit may be an inverter circuit MP1, MN1 which is connected to receive an input signal 12 and to generate an inverted output signal 13 which is connected over an optional resistor R to an internal signal node 14. Similarly, the protected output circuit 17 may be a buffer or inverter circuit MP2, MN2 which is connected between supply lines in a second domain (e.g., VDD2, GND2) to receive the internal signal node 14 and to generate an output signal 18. In operation, the complementary diodes 15, 16 facilitate the absorption of both positive and negative voltage ESD voltages and currents generated at the transmitting circuit 11. Depending on the polarity of ESD voltage, upon the occurrence of an ESD event, one of the two complementary diodes 15, 16 will turn ON at the forward turn-on voltage of the diode (approximately 0.7 volts) so that the bulk of the ESD current will go through the forward biased diode.

As will be appreciated, ESD protection circuits using diodes formed with conventional core P+/n-well and N+/p-well junctions are suitable for certain technologies where the active areas are arranged in continuous lines of alternating n-wells and p-wells. However, there are numerous design challenges and constraints with using conventional diode structures to protect against ESD events, especially with newer integrated circuit designs which use standard cell design layouts that can be disrupted by inserting an ESD protection circuit which requires a large circuit area.

Figure 2:
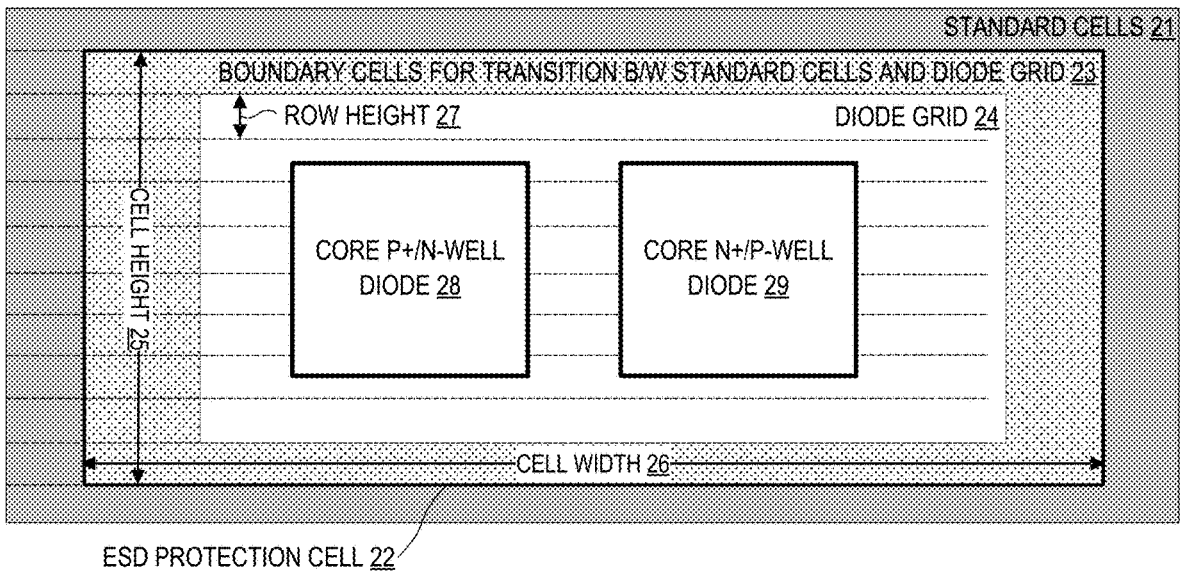
FIG. 2 depicts a portion of a conventional layout architecture of a standard cell form-factor integrated circuit which includes an ESD protection device formed with core P+/n-well and N+/p-well diodes in series between supply lines to protect an output against voltage transients.

To provide an illustrative example of how the design constraints for standard cell integrated circuit layouts can be disrupted by including conventional ESD protection circuits, reference is now made to FIG. 2 which depicts, in plan view, a portion of a conventional layout architecture 20 of a standard cell form-factor integrated circuit which includes an ESD protection device cell 22 formed with a core P+/n-well diode 28 and a core N+/p-well diode 29 in series between supply lines to protect the output against voltage transients. In the depicted layout portion 20, the outermost area 21 represents the region where standard cells are located, and surrounds the ESD protection cell 22 which includes a boundary cell region 23 and a diode grid 24 which surround the core P+/n-well diode 28 and a core N+/p-well diode 29.

Though not explicitly shown, the standard cell area 21 will include standard design cell which are generated by system designers using commercially available design tools, such as electronic design automation (EDA) and computer aided design (CAD) tools, to integrate different logic functions into an integrated circuit (IC) using standard design cells. Each standard cell may include a plurality of transistors, (e.g., complementary FinFET) devices that are used to implement logic functions, such as Boolean functions (e.g., AND, OR, and NOT), storage functions (e.g., flip-flops, latches, and buffers), and digital combinational functions (e.g., multiplexers and demultiplexers). With each standard cell having a predetermined geometry (width and height), the design tools include a library (known as a standard cell library) that stores the standard cell definitions for these logic functions which are selected and placed in rows and columns. Upon completing the placement, the semiconductor device design is simulated, verified, and subsequently transferred to a chip (i.e., formed in silicon).

Surrounding the ESD protection cell 22, the boundary cell region 23 is located to provide a transition between the standard cell area 21 and ESD protection cell 22. With advanced designs, the insertion of boundary cells (or endcap cells) at the end of each row can be used to isolate the different blocks in a system-on-chip (SoC) by protecting each block from external signals, breaking the continuity of the n-well to prevent n-well spacing violations, managing substrate and well noise, and the like.

In the ESD protection cell 22, the core P+/n-well diode 28 may be formed by selectively implanting a P+ region or ring into a substrate n-well, thereby forming a p-diode in the n-well. In similar fashion, the core N+/p-well diode 29 may be formed by selectively implanting an N+ region or ring into a p-well or substrate, thereby forming an n-diode in the p-well/substrate. Though not explicitly shown, the ESD protection cell 22 may be connected with metal interconnect layers to connect the core P+/n-well diode 28 between a signal node and a first supply voltage (e.g., VDD2), and to connect the core N+/p-well diode 29 between the signal node and a second supply voltage (e.g., GND2).

In the depicted ESD protection cell 22, the total cell height 25 (10 rows, each including one n-well and one adjacent p-well) is defined by the heights of the diode grid 24 (8 rows) and the boundary cells 23 (2 rows) representing the minimal vertical spacing between two standard cell grids. In addition, the total cell width 26 is defined by the widths of the diode grid 24 and the boundary cells 23 representing the minimal horizontal spacing between two standard cell grids. As a result, even in the most area-compact implementation, this solution (in a standard cell form-factor) would occupy 10 standard cell rows to satisfy design rule checking (DRC) constraints. The large area requirement makes this solution unattractive and inefficient in terms of circuit area requirements.

Figure 3:
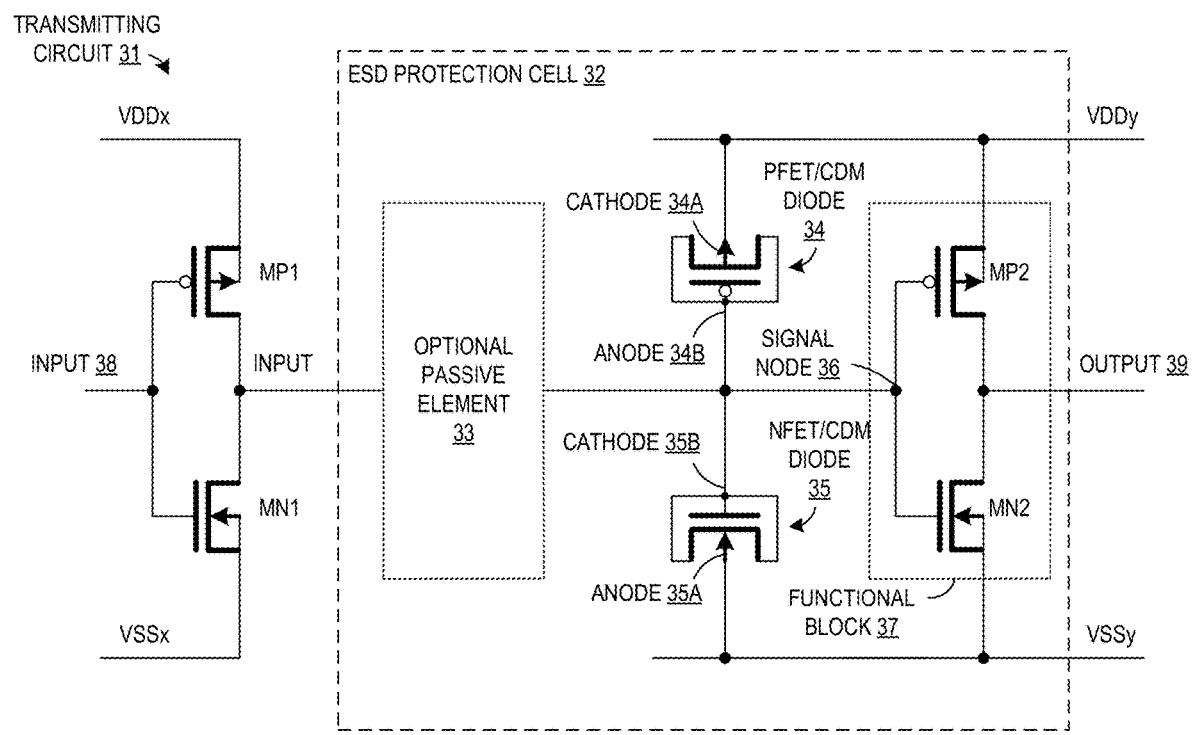
FIG. 3 depicts a simplified circuit schematic diagram of a CDM protection cell which uses a dual diode protection scheme implemented with PFET and NFET CDM diodes in accordance with selected embodiments of the present disclosure.

To address these shortcomings and deficiencies and others from the conventional ESD protection solutions, reference is now made to FIG. 3 which depicts a simplified circuit schematic diagram 30 of an ESD protection cell 32 to provide additional details for an improved understanding of selected embodiments of the present disclosure. Generally speaking the ESD protection circuit 32 is connected between an input transmitting circuit 31 and an output node 39 to provide a compact standard cell ESD protection device and associated method of operation for protecting against damage at the functional block 37 from voltage transient events generated by the input transmitting circuit 31.

As will be appreciated, the transmitting circuit 31 may be any functional circuit to generate the INPUT signal to the ESD protection cell 32. For example, the transmitting circuit 31 may be an inverter circuit MP1, MN1 which is connected between supply lines in a first domain (e.g., VDDx, VSSx) to receive an input signal 38 and to generate an inverted INPUT signal to the ESD protection cell 32. However, the transmitting circuit 31 may also be a buffer, a level-shifter, or an external I/O pad or pin which generates an ESD event on the INPUT signal line. And while the transmitting circuit 31 is shown as being connected to supply lines VDDx, VSSx in a different domain than the supply lines VDDy, VSSy of the ESD protection cell 32, ESD protection cell 32 may also be used if VDDx and VDDy were the same net or if VSSx and VSSy were the same net since ESD voltage transient events can also arise when the transmitting circuit 31 and the ESD protection cell 32 are in the same voltage domain but separated from one another by a long signal routing path (e.g., over 100 microns).

At the ESD protection cell 32, any transient voltage or ESD event stress from the received INPUT signal is limited or clamped by using the complementary CDM diode pair 34, 35 to protect the input gates of the CMOS FETs MP2, MN2 of the functional block 37. At a minimum, the ESD protection cell 32 includes a pair of CDM diodes 34, 35 formed with "dummy" FinFET devices (e.g., a p-FinFET and n-FinFET) connected in series between supply lines VDDy, VSSy. Each "dummy" FinFET has a supply-connected first diode terminal formed with the FinFET body well, and a signal node-connected second diode terminal formed with the shorted gate, source and drain regions of the FinFET. In particular, a first "dummy" p-FinFET 34 is connected as a FinFET/CDM diode between the signal node and a power supply VDDy, and a second "dummy" n-FinFET 35 is connected as a FinFET/CDM diode between the signal node and a ground supply VSSy. By directly coupling the body (well) of each "dummy" FinFET 34, 35 to its respective supply rail VDDy, VSSy, a first diode terminal (e.g., cathode 34A, anode 35A) is formed. In addition, by shorting together the gate, source, and drain terminals of each FinFET 34, 35, a second diode terminal (e.g., anode 34B, cathode 35B) is formed and tied to the signal node 36. As described hereinbelow, the complementary CDM diode pair 34, 35 are formed to include p-well and n-well taps placed close to the dummy MOSFETs to make good well connections to a first diode terminal, where the second diode terminal is by the gate, source, and drain terminals of each FinFET 34, 35.

In addition, the ESD protection cell 32 may include an optional passive element 33, such as a resistor or capacitor, placed in the signal line before the CDM diodes 34, 35. As will be appreciated, the function of the optional passive element 33 is to enhance the protection against ESD events by helping absorb ESD voltages and currents generated at the transmitting circuit 31, thereby further reducing the ESD stress on the receiving input gates of the CMOS FETs MP2, MN2. The depicted ESD protection cell 32 also includes a functional block 37 in which the protected CMOS FETs MP2, MN2 are located. While the depicted functional block 37 includes an inverter circuit MP2, MN2 which is connected between supply lines in a second domain (e.g., VDDy, VSSy) to receive the input signal node signal 36 and to generate an inverted OUTPUT signal 39, it will be appreciated that the functional block 37 may also be a buffer, a level-shifter, or other functional circuitry requiring ESD protection of its input gates. In addition, the depicted functional block 37 is not required to be located inside the ESD protection cell 32, but may also be located in another cell of the integrated circuit.

One of the key innovative aspects is the implementation of the CDM diodes 34, 35 as MOSFET dummy devices where the source/drain junctions act as the CDM diodes and where the gate terminals are shorted to the source/drain terminals to minimize parasitic capacitance between the signal node and the supply rails. Such "dummy" MOSFET devices can be placed inside a standard cell array, thereby offering a huge area benefit compared to using conventional diodes which would break the alternating well pattern of the standard cell area and which would be difficult to integrate.

Figure 4:
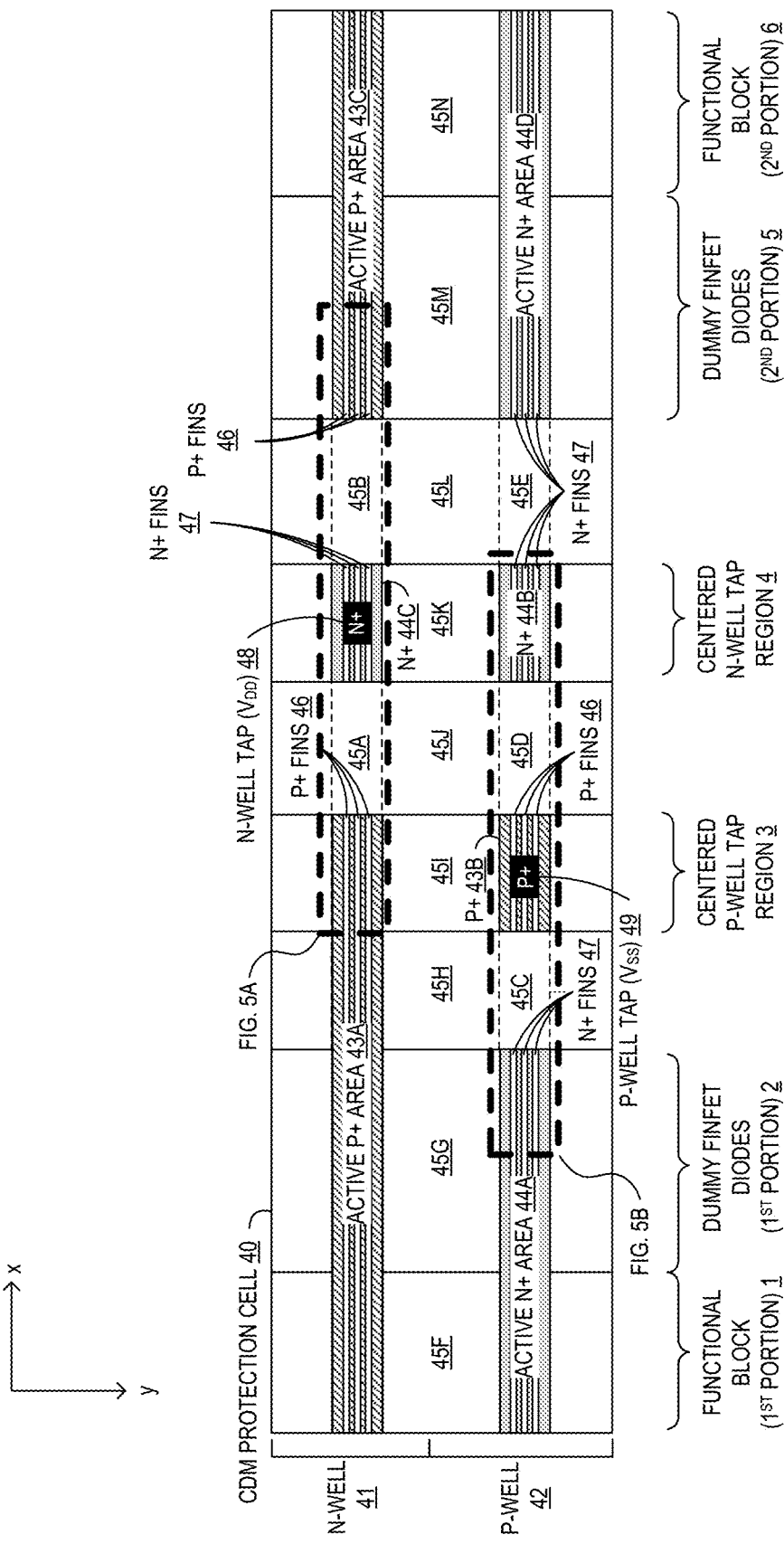
FIG. 4 depicts a first layout architecture of an area-efficient, standard cell compatible CDM protection cell having one or more functional circuit blocks and a pair of "dummy" FinFETs connected as CDM diodes located on opposite sides of centrally positioned n-well and p-well taps in accordance with selected embodiments of the present disclosure.

To provide additional details for an improved understanding of selected embodiments of the present disclosure, reference is now made to FIG. 4 which depicts, in plan view, a layout architecture of a CDM protection cell 40 as a single-row standard cell implementation where the dummy FinFETs and the functional block are partitioned and distributed in two portions placed on either sides of centrally located n-well and p-well taps. As will be appreciated, the layout features depicted in the CDM protection cell 40 do not include every element of the final device (such as gate layers or metal interconnects), but illustrate the relative location and placement of the active areas 43, 44 where the P+ fins 46 and N+ fins 47 are positioned for use in forming the FinFET devices in the functional block, dummy FinFETs, and centered p-well and n-well tap regions.

In particular, the upper portion of the CDM protection cell 40 includes two active P+ areas 43A, 43C formed over the n-well 41 at the peripheral sides of the cell 40. In the active P+ areas 43A, 43C, one or more P+ fins 46 are formed to laterally extend across the cell 40 except for defined active break areas 45A, 45B. The upper portion of the CDM protection cell 40 also includes an active N+ area 44C formed over the n-well 41 to be aligned with and separated from the active P+ areas 43A, 43C by the defined active break areas 45A, 45B. In the active N+ area 44C, one or more N+ fins 47 formed the n-well tap 48 for coupling the n-well region 41 to a first supply voltage VDD.

In similar fashion, the lower portion of the CDM protection cell 40 includes at least two active N+ areas 44A, 44D formed over the p-well 42 at the peripheral sides of the cell 40. In the active N+ areas 44A, 44D, one or more N+ fins 47 are formed to laterally extend across the cell 40 except for defined active break areas 45C, 45D, 45E. The lower portion of the CDM protection cell 40 also includes an active P+ area 43B formed over the p-well 42 to be aligned with and separated from the active N+ areas 44A, 44D by at least the defined active break areas 45C, 45D. In the active P+ area 43B, one or more P+ fins 46 formed the p-well tap 49 for coupling the p-well region 42 to a second supply voltage VSS.

In the depicted example, three parallel rows of P+ and N+ fins 46, 47 are shown, but it will be appreciated that additional or fewer fin rows may be formed. In addition, the design rules will require active area gaps 45A-N between the p+ and n+ active regions 43A-C, 44A-D, though the arrangement, number, and placement of the gaps 45 can vary based on the design requirements. For example, an additional active area gap may be positioned in the p+ active area 43A in alignment with the active area gaps 45H, 45C.

Inside the CDM protection cell 40, one or more gate electrode layers (not shown) are formed to vertically extend across the cell 40 to overlap with the P+ and N+ fins 46, 47, thereby forming p-FinFETs (in the active P+ areas 43) and n-FinFETs (in the active N+ areas 44). These gate electrode layers are typically placed with a regular pattern and a constant pitch over the standard cell area, and they may also be used to electrically isolate functional blocks from dummy FinFETs if both of them reside in the same active area. For example, "dummy" FinFETs 5 are isolated from functional block 6 by one or more gate electrodes that run vertically between the two regions. In addition, one or more source/drain contact layers (not shown) are formed to vertically extend across the cell 40 to make source/drain contacts with the P+ and N+ fins 46, 47. With the formation of additional metal interconnect layers (not shown), the p-FinFETs and n-FinFETs may be connected to provide the required circuit functionality of the CDM protection cell 40. By partitioning the "dummy" FinFETs and functional blocks into first and second portions, the separate portions may be symmetrically distributed on both sides of the cell 40.

In particular, the required circuit functionality of the CDM protection cell 40 includes at least a pair of dummy FinFET portions 2, 5 connected as CDM diodes located on opposite sides of centrally positioned p-well and n-well taps 3, 4. As will be appreciated, the CDM diodes are formed from the "dummy" FinFETs by routing one or more metal interconnect layers to short the gate, source and drain terminals of n-FinFETs and p-FinFETS located in the dummy FinFET diode portions 2, 5. And by positioning the dummy FinFET diode portions 2, 5 around the p-well and n-well taps 3, 4 in the center of the cell 40, the well taps 3, 4 not only break the continuous active regions 43, 44, but are positioned in close proximity to the dummy FinFETs to make good well connections.

In addition to the dummy FinFET portions 2, 5, the circuit functionality of the CDM protection cell 40 may also include one or more functional circuit block portions 1, 6. As will be appreciated, any desired functional circuit (e.g., a buffer, level shifter, or inverter) may be formed from FinFETs in the functional circuit block portions 1, 6 by routing one or more metal interconnect layers to connect the gate, source and drain terminals of n-FinFETs and p-FinFETS to provide the desired circuit functionality.

Instead of placing the n-well and p-well tie regions at the end of the cell 40 (which could lead to DRC errors in typical standard cell abutment scenarios), the center placement of the taps 48, 49 allows the dummy FinFETs (CDM diodes) to be symmetrically placed on both sides of the taps ($1^{st}$ and $2^{nd}$ portions), thereby improving the diode performance (on-resistance and failure current). And by placing the outer functional circuit block portions 1, 6 adjacent to the dummy FinFET portions 2, 5, the "dummy" FinFETs are formed to share active P+ and N+ regions with the functional blocks.

By way of illustrating an example implementation, the total cell area for a single row implementation of the CDM protection cell 40 can be 0.332 $\mu m^2$, including an internal N and P diode junction region having a perimeter of 1.384 $\mu m$ and an area of 0.0212 $\mu m^2$. In contrast, the total cell area for a conventional layout architecture of a standard cell 10-row implementation of the ESD protection cell 22 can be 14.24 $\mu m^2$, including an internal N and P diode junction region having a perimeter of 1.63 $\mu m$ and an area of 0.124 $\mu m^2$. In this comparison, the diode sizes are not matched, but the single row implementation of the CDM protection cell 40 requires only 2.3% of the circuit area of the conventional ESD protection cell. In order to match the diode sizes, six of the CDM protection cells 40 would be used, resulting in a total cell area of 1.992 $\mu m^2$ which is only 13.98% of the circuit area of the conventional ESD protection cell.

As will be appreciated, the single-row implementation of the CDM protection cell 40 may require defined cell edge spacing table rules for placement and routing (P&R) tools to avoid active area placement restrictions. For example, there may be architectures wherein active area breaks (e.g., 45A-E) inside a CDM protection cell 40 can lead to placement restrictions with regard to adjacent standard cells with active breaks that are placed above or below. Examples of such placement restrictions may disallow active area breaks in adjacent cells that do not align with the active area breaks 45 of the cell 40, but otherwise allow adjacent active area breaks which align with the active area breaks 45 of the cell 40. Since P&R tools (e.g., Cadence Innovus, Synopsys ICCII, etc.) support cell edge spacing table rules, proper definition of these cell edge spacing table rules would automatically resolve these adjacent cell placement restrictions at the SoC level.

As disclosed herein, the specific placement and spacing of the dummy FinFET and well taps in the active P+ and N+ areas in the ESD protection cell will depend on the design layout restrictions required by the specific cell layout requirements, though generally speaking, the "dummy" p-FinFET and n-FinFET devices should be aligned for connection by a common gate electrode to short the gate, source, and drain regions together. In addition, the non-overlapping n-well and p-well taps should be positioned internally within a pair of CDM diodes formed with "dummy" p-FinFET and n-FinFET devices. If desired, the ESD protection cell may also include a functional circuit block portion placed on one or both outermost ends of the ESD protection cell. For an improved understanding of selected embodiments of the present disclosure, reference is now made to FIGS. 5A-B which depict perspective views of the PFET and NFET CDM diodes and well taps used to form a CDM protection cell in a p-type substrate 51.

Figure 5A:
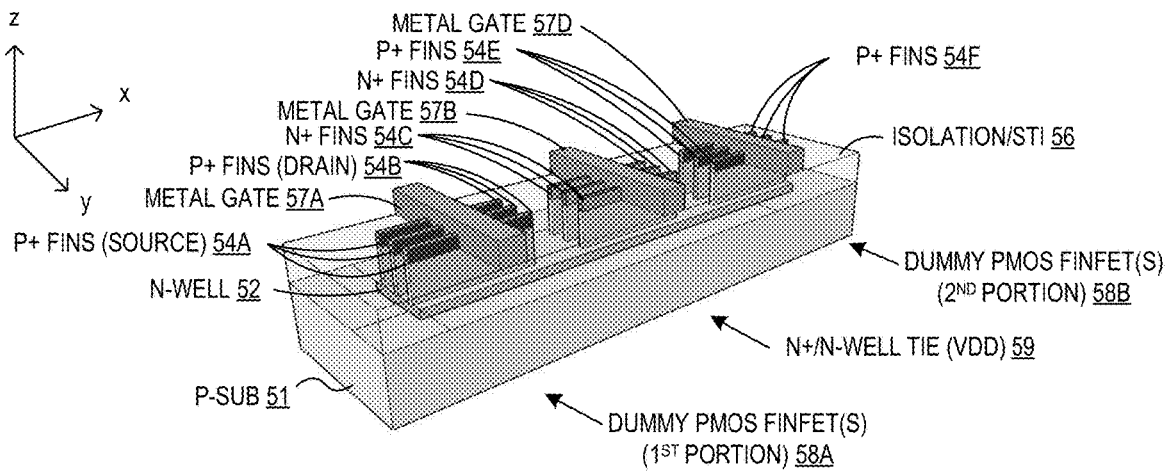
FIG. 5A depicts a perspective view of a PFET CDM diode formed with first and second "dummy" p-FinFET portions located on opposite sides of a centrally positioned n-well tap in accordance with selected embodiments of the present disclosure

In particular, FIG. 5A depicts a perspective view 50A of a PFET CDM diode formed with first and second dummy p-FinFET portions 58A, 58B located on opposite sides of a centrally positioned N+/n-well tie 59 in accordance with selected embodiments of the present disclosure. The depicted first dummy PMOS FinFET portion 58A is formed with a plurality of parallel P+ fin structures 54A-B which are aligned in the x-direction to extend up (in the z-direction) from the underlying n-well region 52 formed in the p-substrate 51. As formed, the parallel P+ fin structures 54A-B protrude above the shallow trench isolation (STI) layer 56 so that they are separated in both the x-direction and y-direction by STI layers 56. The depicted first dummy PMOS FinFET portion 58A also includes one or more metal gate electrode layers 57A extending perpendicularly in the y-direction to overlap with the parallel P+ fin structures 54A-B, thereby forming P+ fin source regions 54A and P+ fin drain regions 54B. Completing the first dummy PMOS FinFET portion 58A, one or more source/drain contact layers (not shown) may be formed to extend in the y-direction to make source/drain contacts with the P+ fin source/drain regions 54A/B.

At the source/drain junction between the P+ fin structures 54A/B and the underlying n-well 52, a PFET CDM diode is formed where the n-well region 52 forms one terminal of the PFET CDM diode. And with the formation of additional metal interconnect layers (not shown) over the first dummy PMOS FinFET portion 58A, the gate 57A and P+ fin source/drain regions 54A/B are shorted to a second terminal of the PFET CDM diode and connected to a signal node. The depicted second "dummy" PMOS FinFET portion 58B may be formed on the opposite end of the P+ active area with an identical structure, including a metal gate electrode 57D and P+ fin source/drain regions 54E/F which are connected to form another PFET CDM diode having a first terminal (formed in the n-well region) and a second terminal (formed by the shorted gate 57D and P+ fin source/drain regions 54E/F). By partitioning the dummy PMOS FinFETs into first and second portions, the separate portions may be symmetrically distributed on both sides of the N+/n-well tie 59.

Between the first and second dummy PMOS FinFET portions 58A, 58B, the N+/n-well tie 59 may be formed using the same basic structure, though connected differently through the metal interconnect layers. In particular, the depicted N+/n-well tie 59 is formed with a plurality of parallel N+ fin structures 54C-D which are aligned in the x-direction to extend up from the underlying n-well region and to protrude above the shallow trench isolation (STI) layer 56 so that they are separated in both the x-direction and y-direction by STI layers 56. The depicted N+/n-well tie 59 may also include one or more metal gate electrode layers 57B extending perpendicularly in the y-direction to overlap with the parallel N+ fin structures 54C-D. Completing the N+/n-well tie 59, one or more source/drain contact layers (not shown) may be formed to extend in the y-direction to make contact with the N+ fin structures 54C-D. With the formation of additional metal interconnect layers (not shown) over the N+/n-well tie 59, the N+/n-well tie 59 is connected to a first supply voltage (e.g., VDD).

Figure 5B:
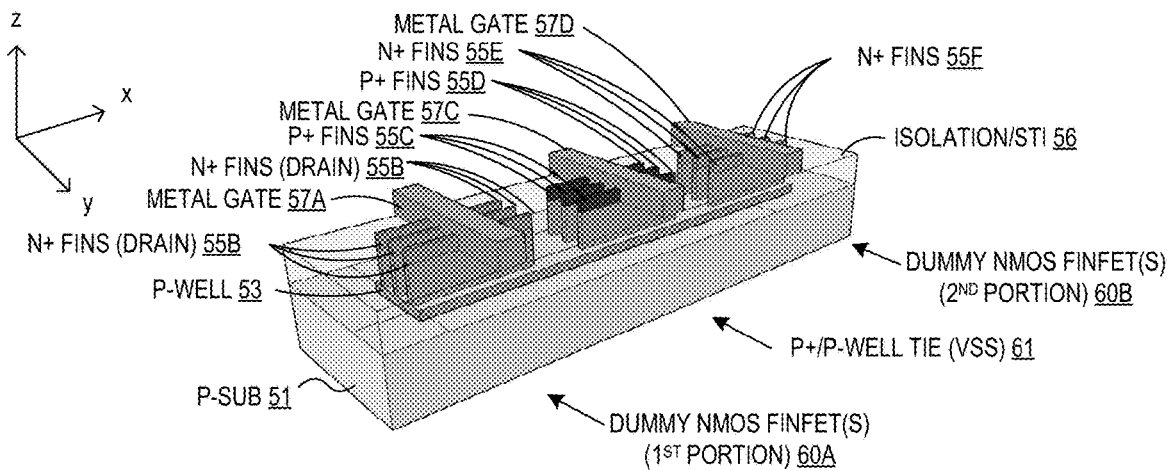
FIG. 5B depicts a perspective view of an NFET CDM diode formed with first and second "dummy" n-FinFET portions located on opposite sides of a centrally positioned p-well tap in accordance with selected embodiments of the present disclosure.

In addition, FIG. 5B depicts a perspective view 50B of an NFET CDM diode formed with first and second dummy n-FinFET portions 60A, 60B located on opposite sides of a centrally positioned P+/p-well tap in accordance with selected embodiments of the present disclosure. The depicted first dummy NMOS FinFET portion 60A is formed with a plurality of parallel N+ fin structures 55A-B which are aligned in the x-direction to extend up (in the z-direction) from the underlying p-well region 53 formed in the p-substrate 51. As formed, the parallel N+ fin structures 55A-B protrude above the shallow trench isolation (STI) layer 56 so that they are separated in both the x-direction and y-direction by STI layers 56. The depicted first dummy NMOS FinFET portion 60A also includes one or more metal gate electrode layers 57A extending perpendicularly in the y-direction to overlap with the parallel N+ fin structures 54A-B, thereby forming N+ fin source regions 55A and N+ fin drain regions 55B. Completing the first dummy NMOS FinFET portion 60A, one or more source/drain contact layers (not shown) may be formed to extend in the y-direction to make source/drain contacts with the N+ fin source/drain regions 55A/B.

At the source/drain junction between the N+ fin structures 55A/B and the underlying p-well 51, an NFET CDM diode is formed where the p-well region 53 forms one terminal of the NFET CDM diode. And with the formation of additional metal interconnect layers (not shown) over the first dummy NMOS FinFET portion 60A, the gate 57A and N+ fin source/drain regions 55A/B are shorted to a second terminal of the NFET CDM diode and connected to a signal node. The depicted second dummy NMOS FinFET portion 60B may be formed on the opposite end of the N+ active area with an identical structure, including a metal gate electrode 57D and N+ fin source/drain regions 55E/F which are connected to form another NFET CDM diode having a first terminal (formed in the n-well region) and a second terminal (formed by the shorted gate 57D and N+ fin source/drain regions 55E/F). By partitioning the dummy NMOS FinFETs into first and second portions, the separate portions may be symmetrically distributed on both sides of the P+/P-well tie 61.

And while the labeling of the metal gate electrode layers 57A, 57D in both FIGS. 5A and B indicates that these may be part of the same gate electrode layer extending over both the PFET and NFET CDM diodes, this is not required in every embodiment. For example, separate gate electrode layers could be used for the first dummy PMOS FinFET portion 58A and first dummy NMOS FinFET portion 60A. Similarly, separate gate electrode layers could be used for the second dummy PMOS FinFET portion 58B and second dummy NMOS FinFET portion 60B.

Between the first and second dummy NMOS FinFET portions 60A, 60B, the P+/p-well tie 61 may be formed using the same basic structure, though connected differently through the metal interconnect layers. In particular, the depicted P+/p-well tie 61 is formed with a plurality of parallel P+ fin structures 55C-D which are aligned in the x-direction to extend up from the underlying p-well region and to protrude above the shallow trench isolation (STI) layer 56 so that they are separated in both the x-direction and y-direction by STI layers 56. The depicted P+/p-well tie 61 may also include one or more metal gate electrode layers 57C extending perpendicularly in the y-direction to overlap with the parallel N+ fin structures 55C-D. Completing the P+/p-well tie 61, one or more source/drain contact layers (not shown) may be formed to extend in the y-direction to make contact with the P+ fin structures 55C-D. With the formation of additional metal interconnect layers (not shown) over the P+/p-well tie 61, the P+/p-well tie 61 is connected to a second supply voltage (e.g., VSS).

Though not shown, it will appreciated that additional functional circuitry and/or passive circuit components can be included in the ESD protection cell. For example, additional PMOS and NMOS FinFETs can be formed on either or both ends of the ESD protection cell with appropriate metal interconnect routing to form functioning CMOS circuits, such as buffers, inverters, and/or level shifters having input or receiving FET gates connected to the signal node for protection by the ESD protection circuit. In addition or in the alternative, an integrated circuit resistor may be formed as a polysilicon resistor and/or metal resistor in one or more of the metal interconnect layers.

As will be appreciated, the embodiments disclosed herein are not limited to a particular material for the gate electrode, resistor or metal interconnect layers. For example, gate electrodes may be formed with one or more polysilicon or metal layers over a gate dielectric or insulating layer formed with a high-K dielectric material, such as hafnium based oxide, a hafnium based oxynitride, or a hafnium-silicon oxynitride, hafnium silicate, zirconium silicate, hafnium dioxide and zirconium dioxide.

Figure 6:
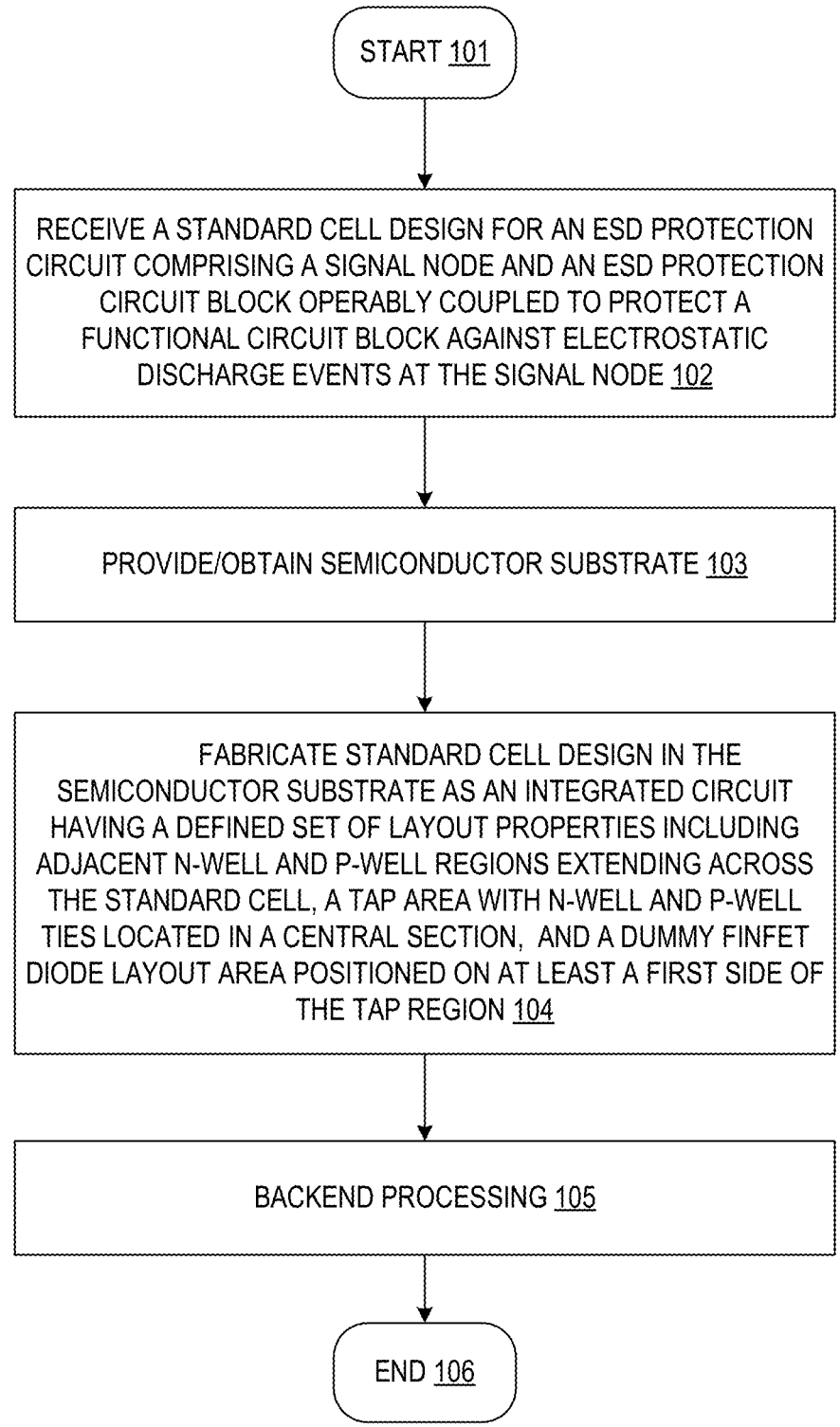
FIG. 6 shows a flowchart depicting a method for fabricating an integrated circuit with a standard cell design for an electrostatic discharge (ESD) protection circuit in accordance with selected embodiments of the present disclosure.

To further illustrate selected embodiments of the present disclosure, reference is now made to FIG. 6 which is a simplified schematic flow chart 100 illustrating various methods for fabricating an integrated circuit with a standard cell design for an electrostatic discharge (ESD) protection circuit. In describing the fabrication methodology 100, the description is intended merely to facilitate understanding of various exemplary embodiments and not by way of limitation. Unless otherwise indicated, the identified processing steps 101-106 may be implemented with one or more individual fabrications steps, including but not limited to depositing, growing, masking, developing, exposing, patterning, implanting, doping, etching, cleaning, stripping, annealing, and/or polishing that are performed in any desired order. Since the steps illustrated in FIG. 6 and described below are provided by way of example only, it will be appreciated that alternative embodiments of fabrication method 100 may include additional steps, omit certain steps, substitute or alter certain steps, or perform certain steps in an order different than that illustrated in FIG. 11.

Once the fabrication methodology starts (step 101), a standard cell design for an ESD protection circuit is received. In selected embodiments, the standard cell design includes a signal node and a CDM protection circuit block operably coupled to protect a functional circuit block against electrostatic discharge events at the signal node. The functional circuit block may be included in the standard cell, or may be included in another cell connected to the standard cell.

At step 103, a semiconductor substrate is provided or obtained. For example, a semiconductor wafer structure may be provided which is formed with a semiconductor substrate structure having a predetermined crystallographic orientation and thickness (e.g., approximately 0.6 mm). Depending on the type of transistor device being fabricated, the semiconductor substrate structure may be implemented as a bulk silicon substrate, single crystalline silicon (doped or undoped), epitaxial semiconductor material, SOI substrate, or any semiconductor material including, for example, Si, Si C, SiGe, SiGeC, Ge, GaAs, InAs, InP as well as other Group III-V compound semiconductors or any combination thereof, and may optionally be formed as the bulk handling wafer. As will be appreciated, the semiconductor substrate structure may be appropriately doped to provide n-type (electron) or p-type (hole) carriers.

At step 104, a sequence of steps are used to fabricate the standard cell design in the semiconductor substrate as an integrated circuit having a defined set of layout properties which include adjacent n-well and p-well regions extending across the standard cell. The layout properties also include a tap area with n-well and p-well ties, where the n-well tie is located in a central section of the n-well region for connecting the n-well to a first supply voltage, and where the p-well tie is located in a central section of the p-well region for connecting the p-well to a second supply voltage. The layout properties also include a dummy FinFET diode layout area positioned on one or both sides of the tap region. As formed, the dummy FinFET diode layout area includes a first p-FinFET formed in the n-well region and connected as a first diode between the first supply voltage and the signal node with the gate, source, and drain regions shorted of the first p-FinFET shorted to the signal node. The dummy FinFET diode layout area also includes a second n-FinFET formed in the p-well region and connected as a second diode between the second supply voltage and the signal node with the gate, source, and drain regions of the second n-FinFET shorted to the signal node. When fabricating the standard cell, the sequence of fabrication steps may include selectively implanting a single row standard cell area of the semiconductor substrate with the n-well and p-well regions. In addition, the fabrication steps may include selectively forming a plurality of semiconductor fins on the semiconductor substrate extending up from the n-well and p-well regions. As formed, the plurality of semiconductor fins may include P+ doped semiconductor fins formed over the n-well region in one or more defined P+ active areas of the dummy FinFET diode layout area, N+ doped semiconductor fins formed over the n-well region in the tap area, N+ doped semiconductor fins formed over the p-well region in one or more defined N+ active areas of the dummy FinFET diode layout area, and P+ doped semiconductor fins formed over the p-well region in the tap area. As will be appreciated, the fabrication steps may be formed with a combination of epitaxial semiconductor growth and/or selective etch processes. Non-limiting example of epitaxial growth include ultra-high vacuum chemical vapor deposition (UHV-CVD) at low temperature (e.g., around 550° C.), and/or low pressure chemical vapor deposition (LP-CVD) at higher temperature (e.g., around 900° C.) and by other means known in the art. In addition, the fabrication steps may include selectively forming one or more FinFET gate electrodes aligned perpendicularly to the plurality of semiconductor fins to define the first p-FinFET and second n-FinFET in the dummy FinFET diode layout area. Finally, the fabrication steps may include selectively forming one or more metal interconnect layers over the substrate to connect the first p-FinFET as the first diode, to connect the second n-FinFET as the second diode, to tie the N+ doped semiconductor fins formed over the n-well region to the first supply voltage, and to tie the P+ doped semiconductor fins formed over the p-well region to the second supply voltage.

At step 105, implanting and backend processing are performed before the fabrication methodology ends at step 106. Such backend processing may include thermal treatments for the implanted regions are applied at some point in the fabrication sequence to activate the implanted regions and otherwise repair implantation damage. In addition, other circuit features may be formed on the wafer structure, such as transistor devices, using one or more of sacrificial oxide formation, stripping, isolation region formation, well region formation, gate dielectric and electrode formation, extension implant, halo implant, spacer formation, source/drain implant, heat drive or anneal steps, and polishing steps, along with conventional backend processing (not depicted), typically including formation of multiple levels of interconnect that are used to connect the transistors in a desired manner to achieve the desired functionality. Thus, the specific sequence of steps used to complete the fabrication of the semiconductor structures may vary, depending on the process and/or design requirements.

Accordingly, the fabrication method 100 provides the overall process flow sequence for making a standard cell design for an ESD protection circuit. It should be understood that certain steps in the process flow sequence 100 may be performed in parallel with each other or with performing other processes. In addition, the particular ordering of the process flow sequence 100 may be modified, while achieving substantially the same result. Accordingly, such modifications are intended to be included within the scope of the inventive subject matter.

By now it should be appreciated that there has been provided an integrated circuit having a compact standard cell electrostatic discharge (ESD) protection device and associated methods of operation and fabrication for protecting an integrated circuit signal node against transient voltage events using a dual-diode protection scheme implemented with "dummy" n-FinFET and p-FinFET devices formed with centered well taps to integrate seamlessly within the standard cell integrated circuit. As disclosed, the integrated circuit includes a signal node connected to receive an electrostatic discharge voltage from a transmitting circuit. In selected embodiments, the transmitting circuit may include an input signal pad, pin or functional circuit. In addition, the integrated circuit includes an electrostatic discharge (ESD) protection circuit connected between a first voltage supply and a second voltage supply, where the ESD protection circuit includes a first FinFET diode connected between the signal node and the first voltage supply, and a second FinFET diode connected between the signal node and the second voltage supply. As fabricated, the first and second FinFET diodes are each formed with a finFET device comprising (1) a body well region forming a first diode terminal connected to one of the first or second voltage supplies, and (2) a shorted gate, source, and drain regions forming a second diode terminal connected to the signal node. In selected embodiments, the first FinFET diode may be a p-FinFET diode formed with a p-FinFET device connected between the first voltage supply and the signal node, and the second FinFET diode may be a n-FinFET diode formed with a n-FinFET device connected between the second voltage supply and the signal node. The integrated circuit also includes a protected circuit having a first FinFET operably coupled to the signal node that is protected against electrostatic discharge voltage damage by the electrostatic discharge protection circuit. In selected embodiments, the electrostatic discharge protection circuit may be a standard cell design which includes a centrally located n-well tap positioned internally between first and second portions of the first FinFET diode formed, respectively, with a pair of p-FinFET devices. The standard cell design may also include a centrally located p-well tap positioned internally between first and second portions of the second FinFET diode formed, respectively, with a pair of n-FinFET devices. In selected embodiments, the standard cell design may also include a passive input element connected between the transmitting circuit and the signal node. In other embodiments, the standard cell design may also include the protected circuit. In such embodiments, the protected circuit may be positioned on one or more peripheral ends of the standard cell.

In another form, there is provided an integrated circuit device and method of manufacture and operation wherein a compact standard cell electrostatic discharge (ESD) protection circuit block is operably connected in a standard cell to protect a functional circuit block against electrostatic discharge events at a signal node. As disclosed, the electrostatic discharge protection circuit block has a set of layout properties which include adjacent n-well and p-well regions extending across the standard cell. In selected embodiments, the adjacent n-well and p-well regions are formed in a single row standard cell. The layout properties also include a tap region which includes a n-well tie located in a central section of the n-well region for connecting the n-well to a first supply voltage, and a p-well tie located in a central section of the p-well region for connecting the p-well to a second supply voltage. In addition, the layout properties include a dummy FinFET diode layout region positioned on at least a first side of the tap region to include (1) a first p-FinFET formed in the n-well region and connected as a first diode between the first supply voltage and the signal node with the gate, source, and drain regions shorted of the first p-FinFET shorted to the signal node, and (2) a second n-FinFET formed in the p-well region and connected as a second diode between the second supply voltage and the signal node with the gate, source, and drain regions of the second n-FinFET shorted to the signal node. In selected embodiments, the dummy FinFET diode layout region is positioned on opposite sides of the tap region. In addition, selected embodiments of the first diode include (1) a first diode terminal formed in the n-well region of the first p-FinFET, and (2) a second diode terminal formed by shorting the gate, source, and drain regions of the first p-FinFET to the signal node. In selected embodiments, the dummy FinFET diode layout region may include a plurality of first p-FinFETs formed in the n-well region and connected as the first diode, and a plurality of second n-FinFETs formed in the p-well region and connected as the second diode. In addition, selected embodiments of the second diode include (1) a first diode terminal formed in the p-well region of the second n-FinFET, and (2) a second diode terminal formed by shorting the gate, source, and drain regions of the second n-FinFET to the signal node. In selected embodiments, the functional circuit block is included in the standard cell and peripherally positioned on at least one side of the tap region. In such embodiments, the dummy FinFET diode layout region may be positioned in the standard cell on opposite sides of the tap region, and the functional circuit block is positioned in the standard cell on outermost peripheral sides of the dummy FinFET diode layout region. In other embodiments, the functional circuit block and dummy FinFET diode layout region share an active P+ area and active N+ area in which the first p-FinFET and second n-FinFET are respectively formed. In selected embodiments, the layout properties may also include a passive input element in the standard cell which is connected between the signal node and an output of the transmitting circuit. In addition or in the alternative, the layout properties may include active break areas separating the tap region from the dummy FinFET diode layout region. In selected embodiments, the n-well tie is positioned between first and second portions of the dummy FinFET diode layout region which each include a first p-FinFET formed in the n-well region and connected as the first diode, and where the p-well tie is positioned between first and second portions of the dummy FinFET diode layout region which each include a first n-FinFET formed in the p-well region and connected as the second diode.

In yet another form, there is provided an integrated circuit and method of manufacturing same. As disclosed, the fabrication method includes receiving a standard cell design for an electrostatic discharge (ESD) protection circuit comprising a signal node and an ESD protection circuit block operably coupled to protect a functional circuit block against electrostatic discharge events at the signal node. In addition, the fabrication method includes using a sequence of fabrication processing steps to form the standard cell as an integrated circuit having set of layout properties. As formed, the layout properties include adjacent n-well and p-well regions extending across the standard cell. The layout properties also include a tap area having a n-well tie located in a central section of the n-well region for connecting the n-well to a first supply voltage, and a p-well tie located in a central section of the p-well region for connecting the p-well to a second supply voltage. In addition, the layout properties include a dummy FinFET diode layout area positioned on at least a first side of the tap region. As formed, the dummy FinFET diode layout area includes a first p-FinFET formed in the n-well region and connected as a first diode between the first supply voltage and the signal node with the gate, source, and drain regions shorted of the first p-FinFET shorted to the signal node. The dummy FinFET diode layout area also includes a first n-FinFET formed in the p-well region and connected as a second diode between the second supply voltage and the signal node with the gate, source, and drain regions of the first n-FinFET shorted to the signal node. In selected embodiments, the sequence of fabrication processing steps for forming the standard cell includes obtaining a semiconductor substrate and selectively implanting a single row standard cell area of the semiconductor substrate with the n-well and p-well regions. The sequence of fabrication processing steps also includes selectively forming a plurality of semiconductor fins on the semiconductor substrate extending up from the n-well and p-well regions. As formed, the plurality of semiconductor fins includes P+ doped semiconductor fins formed over the n-well region in one or more defined P+ active areas of the dummy FinFET diode layout area; N+ doped semiconductor fins formed over the n-well region in the tap area; N+ doped semiconductor fins formed over the p-well region in one or more defined N+ active areas of the dummy FinFET diode layout area; and P+ doped semiconductor fins formed over the p-well region in the tap area. In addition, the sequence of fabrication processing steps includes selectively forming one or more FinFET gate electrodes aligned perpendicularly to the plurality of semiconductor fins to define the first p-FinFET and first n-FinFET in the dummy FinFET diode layout area. Finally, the sequence of fabrication processing steps includes selectively forming one or more metal interconnect layers over the substrate to connect the first p-FinFET as the first diode, to connect the first n-FinFET as the second diode, to tie the N+ doped semiconductor fins formed over the n-well region to the first supply voltage, and to tie the P+ doped semiconductor fins formed over the p-well region to the second supply voltage.

Although the described exemplary embodiments disclosed herein are directed to an ESD protection cell design and methodology which provides CDM cross-domain protection benefits to the CMOS gates of a functional receiving circuit or block by using a dual-diode "dummy" FinFETs connected as CDM diodes, the present invention is not necessarily limited to the example embodiments which illustrate inventive aspects of the present invention that are applicable to a wide variety of circuit designs and operations. For example, the disclosed ESD protection cell design and methodology can provide HBM protection benefits for CMOS gates of a functional receiving circuit or block. In addition, the protected functional receiving circuit or block is not required to be on a separate domain from the transmitting circuit which generates the transient voltage event. For example, the transmitting circuit and protected functional receiving circuit or block may be connected to the same supply voltage lines VDD, VSS and still generate disruptive transient voltage event when separated from one another by a long signal routing path (e.g., over 100 microns). Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the identification of the circuit design and layout configurations provided herein is merely by way of illustration and not limitation and other circuit arrangements may be used in order to provide ESD protection with an area-efficient standard cell design. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

The preceding merely illustrates the principles of certain examples. It will thus be appreciated that those skilled in the art will be able to devise various arrangements which, although not explicitly described or shown herein, embody the principles and are included within their spirit and scope. Furthermore, all examples and conditional language recited herein are principally intended expressly to be only for pedagogical purposes and to aid the reader in understanding the principles and the concepts contributed by the inventors to furthering the art, and are to be construed as being without limitation to such specifically recited examples and conditions. Moreover, all statements herein reciting principles, aspects, and embodiments, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit, comprising:
    a signal node coupled to receive an electrostatic discharge voltage from a transmitting circuit;
    an electrostatic discharge protection circuit connected between a first voltage supply and a second voltage supply, comprising:
        a first FinFET diode connected between the signal node and the first voltage supply, and
        a second FinFET diode connected between the signal node and the second voltage supply; and
    a protected circuit comprising a first FinFET operably coupled to the signal node that is protected against electrostatic discharge voltage damage by the electrostatic discharge protection circuit,
    where the first and second FinFET diodes are each formed with a finFET device comprising (1) a body well region forming a first diode terminal connected to one of the first or second voltage supplies, and (2) shorted gate, source, and drain regions forming a second diode terminal connected to the signal node.

2. The integrated circuit of claim 1, where the transmitting circuit comprises an input signal pad, pin or functional circuit connected between third and fourth voltage supplies.

3. The integrated circuit of claim 1, where the first FinFET diode comprises a p-FinFET diode formed with a p-FinFET device connected between the first voltage supply and the signal node, and where the second FinFET diode comprises a n-FinFET diode formed with a n-FinFET device connected between the second voltage supply and the signal node.

4. The integrated circuit of claim 1, where the electrostatic discharge protection circuit comprises a standard cell design comprising:
    a centrally located n-well tap positioned internally between first and second portions of the first FinFET diode formed, respectively, with a pair of p-FinFET devices; and
    a centrally located p-well tap positioned internally between first and second portions of the second FinFET diode formed, respectively, with a pair of n-FinFET devices.

5. The integrated circuit of claim 4, where the standard cell design comprises a passive input element connected between the transmitting circuit and the signal node.

6. The integrated circuit of claim 4, where the protected circuit is included in the standard cell design.

7. The integrated circuit of claim 6, where the protected circuit is positioned on one or more peripheral ends of the standard cell.

8. An integrated circuit device comprising a signal node and an electrostatic discharge protection circuit block operably coupled in a standard cell to protect a functional circuit block against electrostatic discharge events at the signal node, where the electrostatic discharge protection circuit block has a set of layout properties comprising:
   adjacent n-well and p-well regions extending across the standard cell;
   a tap region comprising:
      a n-well tie located in a central section of the n-well region for connecting the n-well to a first supply voltage, and
      a p-well tie located in a central section of the p-well region for connecting the p-well to a second supply voltage; and
   a dummy FinFET diode layout region positioned on at least a first side of the tap region, comprising:
      a first p-FinFET formed in the n-well region and connected as a first diode between the first supply voltage and the signal node with the gate, source, and drain regions of the first p-FinFET shorted to the signal node, and
      a second n-FinFET formed in the p-well region and connected as a second diode between the second supply voltage and the signal node with the gate, source, and drain regions of the second n-FinFET shorted to the signal node.

9. The integrated circuit device of claim 8, where the dummy FinFET diode layout region is positioned on opposite sides of the tap region.

10. The integrated circuit device of claim 8,
   where the first diode comprises (1) a first diode terminal formed in the n-well region of the first p-FinFET, and (2) a second diode terminal formed by shorting the gate, source, and drain regions of the first p-FinFET to the signal node, and
   where the second diode comprises (1) a first diode terminal formed in the p-well region of the second n-FinFET, and (2) a second diode terminal formed by shorting the gate, source, and drain regions of the second n-FinFET to the signal node.

11. The integrated circuit device of claim 8, where the functional circuit block is included in the standard cell and peripherally positioned on at least one side of the tap region.

12. The integrated circuit device of claim 11, where the dummy FinFET diode layout region is positioned in the standard cell on opposite sides of the tap region, and where the functional circuit block is positioned in the standard cell on outermost peripheral sides of the dummy FinFET diode layout region.

13. The integrated circuit device of claim 11, where the functional circuit block and dummy FinFET diode layout region share an active P+ area and active N+ area in which the first p-FinFET and second n-FinFET are respectively formed.

14. The integrated circuit device of claim 8, where the dummy FinFET diode layout region comprises:
   a plurality of first p-FinFETs formed in the n-well region and connected as the first diode; and
   a plurality of second n-FinFETs formed in the p-well region and connected as the second diode.

15. The integrated circuit device of claim 8, further comprising a passive input element included in the standard cell and connected between the signal node and an output of the transmitting circuit.

16. The integrated circuit device of claim 8, where the set of layout properties further comprise active break areas separating the tap region from the dummy FinFET diode layout region.

17. The integrated circuit device of claim 8, where the adjacent n-well and p-well regions are formed in a single row standard cell.

18. The integrated circuit of claim 8, where the n-well tie is positioned between first and second portions of the dummy FinFET diode layout region which each include a first p-FinFET formed in the n-well region and connected as the first diode, and where the p-well tie is positioned between first and second portions of the dummy FinFET diode layout region which each include a first n-FinFET formed in the p-well region and connected as the second diode.

19. A method of fabricating an integrated circuit comprising:
   receiving a standard cell design for an electrostatic discharge (ESD) protection circuit comprising a signal node and an ESD protection circuit block operably coupled to protect a functional circuit block against electrostatic discharge events at the signal node; and
   forming, with a sequence of fabrication processing steps, the standard cell as an integrated circuit having set of layout properties comprising:
   adjacent n-well and p-well regions extending across the standard cell;
   a tap area comprising:
      a n-well tie located in a central section of the n-well region for connecting the n-well to a first supply voltage, and
      a p-well tie located in a central section of the p-well region for connecting the p-well to a second supply voltage; and
   a dummy FinFET diode layout area positioned on at least a first side of the tap area, comprising:
      a first p-FinFET formed in the n-well region and connected as a first diode between the first supply voltage and the signal node with the gate, source, and drain regions of the first p-FinFET shorted to the signal node, and
      a first n-FinFET formed in the p-well region and connected as a second diode between the second supply voltage and the signal node with the gate, source, and drain regions of the first n-FinFET shorted to the signal node.

20. The method of claim 19, where forming the standard cell comprises:
   obtaining a semiconductor substrate;
   selectively implanting a single row standard cell area of the semiconductor substrate with the n-well and p-well regions;
   selectively forming a plurality of semiconductor fins on the semiconductor substrate extending up from the n-well and p-well regions, where the plurality of semiconductor fins comprises:
      P+ doped semiconductor fins formed over the n-well region in one or more defined P+ active areas of the dummy FinFET diode layout area,
      N+ doped semiconductor fins formed over the n-well region in the tap area, N+ doped semiconductor fins formed over the p-well region in one or more defined N+ active areas of the dummy FinFET diode layout area, and P+ doped semiconductor fins formed over the p-well region in the tap area;

selectively forming one or more FinFET gate electrodes aligned perpendicularly to the plurality of semiconductor fins to define the first p-FinFET and first n-FinFET in the dummy FinFET diode layout area; and selectively forming one or more metal interconnect layers over the substrate to connect the first p-FinFET as the first diode, to connect the first n-FinFET as the second diode, to tie the N+ doped semiconductor fins formed over the n-well region to the first supply voltage, and to tie the P+ doped semiconductor fins formed over the p-well region to the second supply voltage.

* * * * *